United States Patent [19]

Henager, Jr.

[11] 4,431,499

[45] Feb. 14, 1984

[54] METHOD OF SPUTTER ETCHING A SURFACE

[75] Inventor: Charles H. Henager, Jr., Seattle, Wash.

[73] Assignee: The United States of America as represented by the United States Department of Energy, Washington, D.C.

[21] Appl. No.: 352,738

[22] Filed: Feb. 26, 1982

[51] Int. Cl.³ .............................................. C23C 15/00
[52] U.S. Cl. ............................ 204/192 E; 204/192 R; 204/298
[58] Field of Search .................................... 204/192 E

[56] References Cited

U.S. PATENT DOCUMENTS

| | | | |
|---|---|---|---|
| 4,064,030 | 12/1977 | Nakai et al. | 204/192 E |
| 4,114,983 | 9/1978 | Maffitt et al. | 204/192 E |
| 4,160,045 | 7/1979 | Longshore | 204/192 E |
| 4,229,233 | 10/1980 | Hansen et al. | 204/192 E |

FOREIGN PATENT DOCUMENTS 2036627 7/1980 United Kingdom ............ 204/192 E

OTHER PUBLICATIONS

Harding et al., Solar Energy Materials 5(1981) pp. 445-464.
Auciello J. Vac. Sci. Technol. 19(1981) pp. 841-867.
Gittleman et al. Appl. Phys. Lett. 35(1979) pp. 742-744.
Craighead et al. Appl. Phys. Lett. 37(1980) pp. 653-656.

*Primary Examiner*—Arthur P. Demers
*Attorney, Agent, or Firm*—Sandra B. Weiss; John M. Albrecht; Richard G. Besha

[57] ABSTRACT

The surface of a target is textured by co-sputter etching the target surface with a seed material adjacent thereto, while the target surface is maintained at a pre-selected temperature. By pre-selecting the temperature of the surface while sputter etching, it is possible to predetermine the reflectance properties of the etched surface. The surface may be textured to absorb sunlight efficiently and have minimal emittance in the infrared region so as to be well-suited for use as a solar absorber for photothermal energy conversion.

7 Claims, 4 Drawing Figures

NORMAL-HEMISPHERICAL SPECTRAL REFLECTANCE FACTOR, $R_\lambda$

T=483K; 6,000X

T=673K; 16,000X

T=873K; 8,000X

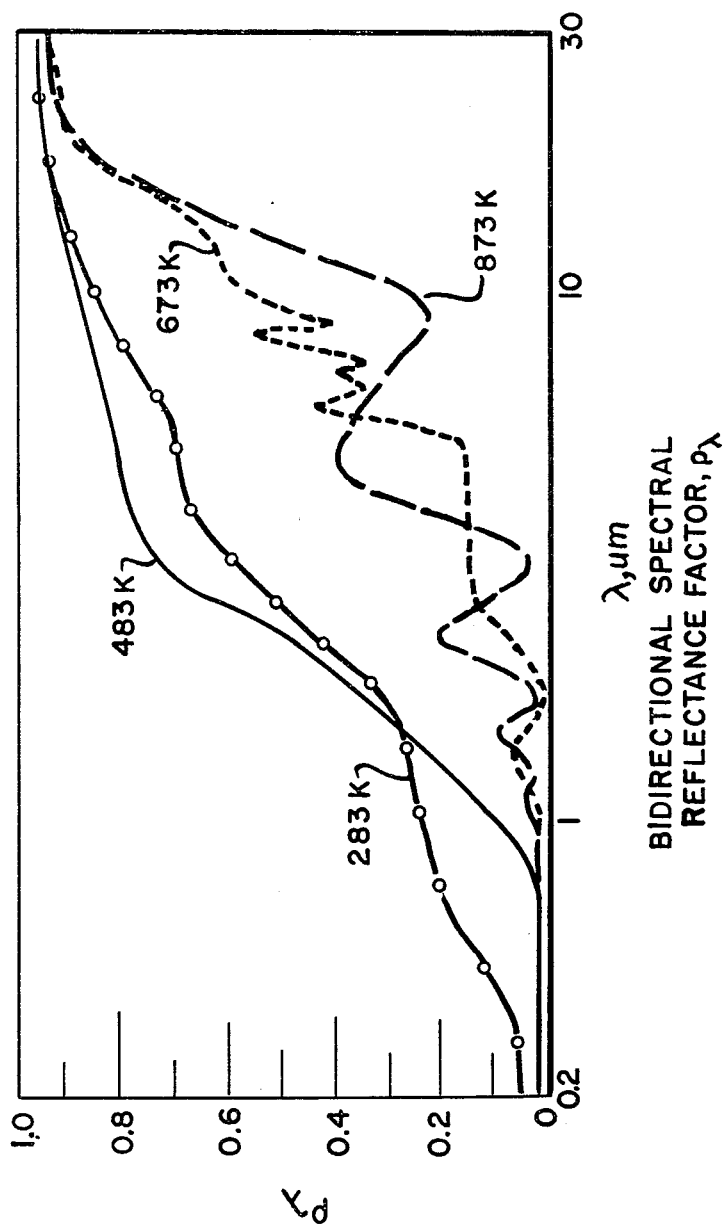

METHOD OF SPUTTER ETCHING A SURFACE

CONTRACTURAL ORIGIN OF THE INVENTION

The United States Government has rights in this invention pursuant to Contract No. DE-AC06-76RLO-1830 between the U.S. Department of Energy and Battelle Pacific Northwest Laboratories.

BACKGROUND OF THE INVENTION

This invention relates to a method of sputter etching surfaces. More particularly, the invention relates to a method of sputter etching surfaces wherein the reflectance properties of the surfaces may be predetermined.

Photothermal conversion of solar radiation may be a significant energy source in the future if relatively high conversion efficiencies can be obtained. Photothermal coversion is usually accomplished by surfaces which have high absorbance properties and low reflectance properties. Such surfaces should have low thermal emittance in the infrared region. In addition, these surfaces must be chemically, thermally, and optically stable for as long as ten years.

One known method for obtaining a solar absorbing surface is the modification of the surface texture to alter the optical properties. By means of textural irregularities of appropriate geometry and size, the absorbance of the surface can be increased as a consequence of the numerous reflections sustained by the incident radiation without noticeably modifying the thermal emissivity of the material. It is known that a surface can be sputter etched to produce textural irregularities, but heretofore it has not been possible to control the texturing process to produce the desired reflectance profile. Such control would add greatly to the utility of the sputter etching process.

SUMMARY OF THE INVENTION

It is an object of the invention to provide a method of sputter etching surfaces.

It is another object of the invention to provide a method of sputter etching surfaces wherein the reflectance properties of the surfaces may be predetermined.

It is another object of the invention to provide a method of sputter etching surfaces for use as solar energy absorbers.

It is another object of the invention to provide a method of sputter etching surfaces for use as solar energy absorbers with preselected reflectance properties.

Additional objects, advantages, and novel features of the invention will be set forth in part in the following description.

In accordance with the invention, the method for sputter etching a surface comprises providing a sputter etching chamber, placing a target material and a seed material adjacent to one another within the chamber, evacuating the chamber, heating the target to a preselected temperature, and bombarding the target and seed material with high-energy ions to sputter etch a textured surface on the target material. The seed material must have a lower sputter yield than the target material, and the two must be insoluble in one another. In addition, the two materials must each have melting points higher than both the sputtering temperature and the operating temperature of the absorber.

The process of sputtering a seed material and target material together, commonly termed co-sputtering, produces a textured surface of rod-like protrusions and ridge-like formations on the target. These surface features are finer at lower sputtering temperatures and coarser at higher sputtering temperatures. The fineness and coarseness of the surface features affects the reflectance properties of the absorber in a foreseeable manner, so that by controlling the temperature of the target during the etching process the reflectance properties of the etched surface may be pre-selected.

DESCRIPTION OF THE DRAWINGS

FIG. 4 is a graph of the bidirectional spectral reflectance factor, $\rho_\lambda$, as a function of the wavelength $\lambda$ in $\mu$m.

DESCRIPTION OF THE PREFERRED EMBODIMENT

The following is a brief description of a preferred embodiment; other embodiments will be readily apparent to those skilled in the art.

Figure 1:
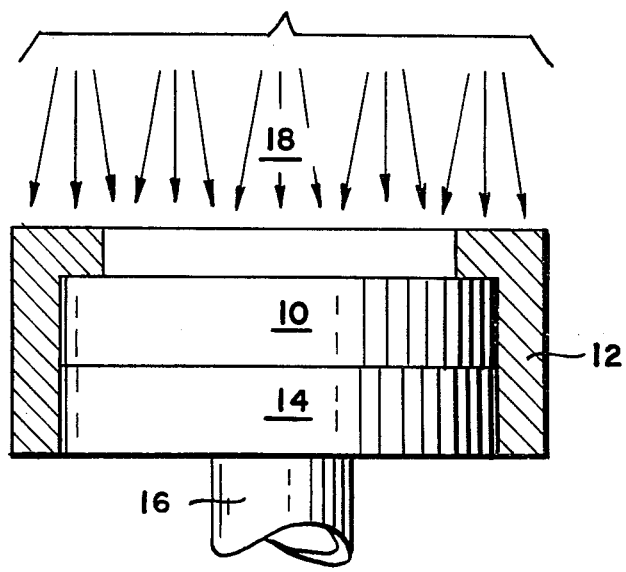
FIG. 1 is a schematic diagram of the target design used to produced a textured surface.

FIG. 1 illustrates a typical arrangement of a target, seed material and ion source in a sputter etching chamber. In this embodiment, the target 10 is surrounded by a collar 12 of seed material of lower sputtering yield than the target. The target 10 is adjacent to a backing plate 14 typically of copper which is supported by a stem 16. A water cooling system, not shown, runs through the stem 16 and backing plate 14 to cool the target 10. A heating element, also not shown, is contained in the stem 16 to heat the backing plate 14 and target 10 for sputter etching at elevated temperatures. The temperature is measured by a thermocouple embedded in the back of the target 10. The assembly is positioned in a chamber suitable for sputter etching, such as a conventional diode chamber or a triode sputtering discharge apparatus. Before etching the chamber is evacuated to less than $1 \times 10^{-4}$ Pa and the target 10 is brought to a preselected temperature. The target 10 is bombarded by high energy Kr ions 18 at approximately 13 mA/cm$^2$ while the total Kr gas pressure in the chamber is maintained at 0.93 Pa. Sputtering time is generally in the range of 5 to 10 minutes but may vary with the materials used.

Figure 2A:
FIGS. 2a, 2b, and 2c are photomicrographs of copper surfaces co-sputtered at 483 K., 673 K., and 873 K., respectively.
Figure 2B:
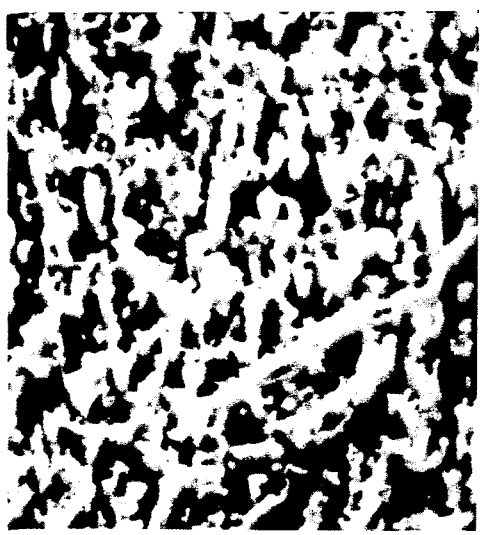
Figure 2C:
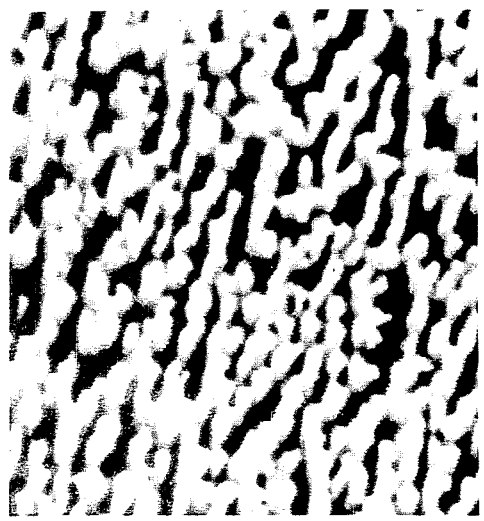

Sputter etching by this method produces a texture on the target surface that may be varied by preselecting the temperature of the target. A surface sputtered at or about room temperature will have very little texture. At elevated temperatures rod-like protrusions and ridge-like formations appear. FIGS. 2a, 2b, and 2c are scanning electron microscope (SEM) photomicrographs of three samples sputtered at 483 K., 673 K., and 873 K., respectively. The samples were oxygen-free high-conductivity (OFHC) copper disks surrounded by collars of stainless steel seed material. By comparing these figures, it may be seen that as the sputtering temperature is increased the surface features progress from finely textured ridge-like formations, to a combination of ridge-like formations and rod-like protrusions and finally to a coarse texture of predominately rod-like protrusions with only a few ridge-like formations. The type of texturing may be described in more quantitative terms by comparing the protrusion spacings of the different samples. From the photomicrographs it may be determined that the spacing varies from a nearest neighbor average of 100 nm at a sputtering temperature of 483 K. to an average of 500 nm at 873 K.

Figure 3:
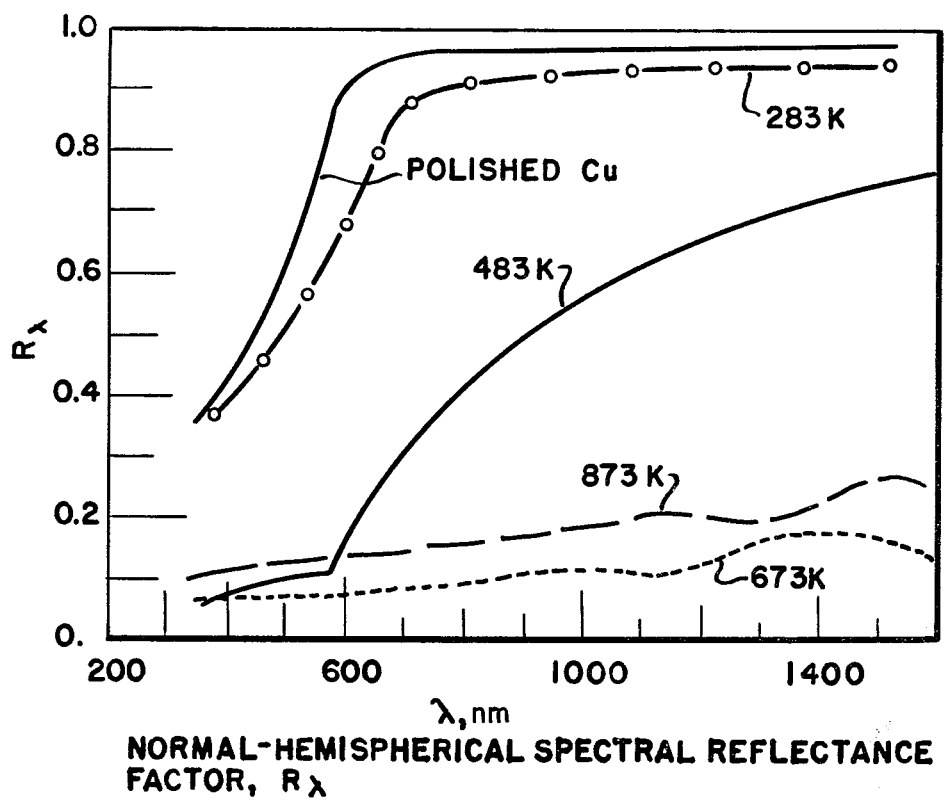
FIG. 3 is a graph of the normal-hemispherical reflectance factor, $R_\lambda$ as a function of the wavelength $\lambda$ in nm.

The temperature-dependent protrusions spacings are determinative of the solar reflectance properties of the textured surfaces. Reflectance properties are crucial to the operation of a solar energy absorber because the energy conversion efficiency of the absorber increases as the solar reflectance decreases. Two types of reflectance may be measured. The normal hemispherical reflectance factor $R_\lambda$ ($\theta=0, \omega=2\pi$) is the total scattered radiation measured over a solid angle $\omega$ of $2\pi$ produced by a beam of light normal to the target surface. The normal hemispherical reflectance factor is the sum of the specular and diffuse components of the reflectance. FIG. 3 is a graph of $R_\lambda$ as a function of the wavelength $\lambda$ in nm for four copper samples sputtered at different temperatures and for polished copper. It may be seen that the sample sputtered at 293 K. which exhibited very little texturing is similar in reflectance properties to polished copper. Those samples sputtered at higher temperatures and exhibiting enhanced surface texturing have significantly lower reflectance factors.

The second type of reflectance factor is the bidirectional reflectance factor $\rho_\lambda(\theta, \theta')$. This is the reflectance measured at an angle $\theta'$ from the surface produced by a beam of light incident to the surface at an angle $\theta$. The bidirectional reflectance factor measures the specular component of the reflectance only. FIG. 4 is a graph of $\pi_\lambda$ as a function of the wavelength in $\mu$m for the four etched samples used in FIG. 3. In this case, both the angle of incidence and the angle of reflectance are 7°. As in FIG. 3, it is evident that the reflectance is strongly dependent on the sputtering temperature and extent of surface texturing of the sample.

Two methods of practicing the invention are illustrated in the following examples:

EXAMPLE I

A target comprising an OFHC copper disk 3.81 cm in diameter by 0.64 cm thick was metallographically polished and electron beam welded to a copper backing plate. The target was provided with a collar of 304 stainless steel seed material which extended 3 mm beyond the target surface. The assembly was attached to a stainless steel stem containing a Nichrome coil heater. The total assembly was placed in a triode sputtering discharge apparatus, and the apparatus was evacuated to less than $1 \times 10^{-4}$ Pa. The target was heated to $673 \pm 5$ K. Sputtering was performed with 400 eV Kr ions at approximately 13 mA/cm$^2$, and continued for 300s.

After sputtering, the target was removed from the backing plate. SEM photomicrographs were used to determine surface texture parameters by measuring the average nearest-neighbor protrusion spacing at several locations on the surface. The normal-hemispherical spectral reflectance factor, $R_\lambda(\theta=0, \pi=2\pi)$, was measured from 350 to 1600 nm with an intergrating sphere using BaSO$_4$ as the reflectance standard. The bidirectional spectral reflectance factor, $\rho_\lambda(\theta=7°, \theta'=7°)$ was measured from 350 to 2500 nm and from 2.5 to 40 $\mu$m using Al as the reference. The average protrusion spacing was about 220 nm.

EXAMPLE II

An OFHC copper target was sputter etched as in Example I except that the target temperature was $873 \pm 5$ K. and the sputtering continued for 600 s. The average protrusion spacing was about 500 nm.

The reflectance properties of a surface may be described in terms of the reflectance cut-off wavelength $\lambda_c$. For the purposes of this application $\lambda_c$ is defined as the wavelength at which the measured reflectance factor is 0.5. A high value of $\lambda_c$ is desirable because as seen in FIGS. 3 and 4 that indicates that the reflectance is low and most of the incident solar energy is being absorbed. By the method of the invention, $\lambda_c$ may be modified by preselecting the target temperature during sputter etching. For example $\lambda_c$ ranged from 500 nm for a scattering temperature of 293 K. or 12 $\mu$m for 873 K. Data relating the sputtering temperature, protrusion spacing, and cut-off wavelength are summarized in Table I.

TABLE I

| Surface Texture and Reflectance Data | | |
|---|---|---|
| Sputtering Temperature (K) | Protrusion Spacing (nm) | $\lambda_c$ (nm) |
| 293 | no protrusions | 500[a] |
| 483 | 60–150 | 900[a] |
| 673 | 125–350 | 7500[b] |
| 873 | 375–625 | 12000[b] |

[a]Determined from FIG. 3
[b]Determined from FIG. 4

Thus by the method of the invention solar absorbers with desired reflectance properties can be prepared by co-sputter etching surfaces at pre-selected temperatures. Many modifications are possible in view of this disclosure. For example, while copper and stainless steel were used here as a target and seed material, almost any metal or non-metal could be used for the target and seed as long as the seed material has a lower sputtering yield than the target, the target and seed are insoluble in each other and neither material melts at the sputtering temperature or the operating temperature of the absorber. Elemental samples of metals and non-metals have been known to be co-sputter etched as well as compounds, alloys and polymers. Furthermore, other metals and metal oxides have been known to be used as seed materials.

Different configurations of the sputtering apparatus may also be used. The ion source may be above the target as shown in FIG. 1 or it may be adjacent to or below the target. A collar type arrangement works efficiently for the seed material but other configurations are possible. In addition, while a krypton ion beam was used here, other non-reactive high energy ions could also be used such as xenon or other noble gases. These and other variations would be known to one skilled in the art of co-sputtering. The embodiment was chosen and described in order to best explain the principles of the invention and its practical applications.

The embodiments of this invention in which an exclusive property or privilege is claimed are defined as follows:

1. A method of preparing a surface with desired reflectance properties comprising
providing a chamber with a target, a seed material adjacent to the target, a means for heating the target, and a source of high-energy ions,
evacuating the chamber, heating the target to a pre-selected temperature, and bombarding the target and seed material with the high-energy ions to sputter etch the surface of the target, the pre-selected temperature of the target being determinative of the reflectance properties of the etched target.

2. The method of claim 1 wherein the sputter yield of the seed material is lower than that of the target.

3. The method of claim 2 wherein the target is copper and the seed material is stainless steel.

4. The method of claim 3 wherein the pre-selected temperature is set between 250 K. and 900 K.

5. The method of claim 1 wherein the high-energy ions are noble gas ions.

6. The method of claim 5 wherein the ions are at an energy level of at least 400 eV.

7. The method of claim 1 wherein the sputtering is of duration between 5 and 10 minutes.

* * * * *